US006058835A

United States Patent [19]
Isogai et al.

[11] Patent Number: 6,058,835
[45] Date of Patent: May 9, 2000

[54] SCREEN APPARATUS

[75] Inventors: Takeyoshi Isogai, Hekinan; Jun Adachi, Nagoya; Harumitsu Tokura, Nishio, all of Japan

[73] Assignee: Fuji Machine Mfg. Co., Ltd., Chiryu, Japan

[21] Appl. No.: 09/435,825

[22] Filed: Nov. 8, 1999

[30]     Foreign Application Priority Data

Dec. 17, 1998 [JP] Japan .................................. 10-359044

[51] Int. Cl.⁷ .................................................. B05C 17/06
[52] U.S. Cl. ........................................ 101/127.1; 101/114
[58] Field of Search ................................ 101/127.1, 127, 101/128.1, 128, 114, 126, 115; 209/399

[56]              References Cited

U.S. PATENT DOCUMENTS

| | | | |
|---|---|---|---|
| 4,573,406 | 3/1986 | Cleemput et al. | 101/127.1 |
| 5,063,842 | 11/1991 | Clarke | 101/128 |
| 5,189,951 | 3/1993 | Webster et al. | 101/128.1 |
| 5,213,217 | 5/1993 | Galton et al. | 209/399 |
| 5,522,148 | 6/1996 | Newman | 101/127.1 |
| 5,893,557 | 4/1999 | Beduhn et al. | 271/228 |

FOREIGN PATENT DOCUMENTS

| | | | |
|---|---|---|---|
| 569041 | 11/1993 | European Pat. Off. | 101/114 |
| 3-33109 | 5/1991 | Japan . | |

*Primary Examiner*—John S. Hilten
*Assistant Examiner*—Anthony H. Nguyen
*Attorney, Agent, or Firm*—Oliff & Berridge, PLC

[57]              ABSTRACT

A screen apparatus including a screen plate including a screen and a screen frame to which the screen is fixed, a support table having a support surface which supports the screen frame, an adjusting device which adjusts a position of the screen plate relative to the support table in a direction parallel to the screen, a fixing device which, when the adjusting device adjusts the position of the screen plate, permits the screen plate to be moved relative to the support table and, after the adjustment, presses the screen frame against the support surface of the support table, thereby fixing the screen plate to the support table, at least three balls which are supported by the screen frame and/or the frame-support table such that each of the balls is movable between its advanced position and its retracted position, at least three biasing devices each of which supports a corresponding one of the balls such that the one ball is rollable and which biases the one ball toward its advanced position, and at least three advanced-position defining devices which define the respective advanced positions of the balls where the balls cooperate with each other to position the screen frame at a position apart from the support surface of the support table.

13 Claims, 7 Drawing Sheets

6,058,835

SCREEN APPARATUS

BACKGROUND OF THE INVENTION

1. Field of the Invention

The present invention relates to a screen device of a screen printing machine, and in particular to the art of adjusting a position of a screen plate including a screen and a screen frame, in a direction parallel to the screen.

2. Related Art Statement

Generally, a screen plate which is employed in a screen printing machine includes a screen and a screen frame to which the peripheral portion of the screen is fixed. When a screen printing operation is carried out, the screen plate is fixed to a frame-support table of the screen printing machine, after a position of the plate relative to the table in a direction parallel to the screen is adjusted. The position of the frame-support table relative to an object to be printed, such as a printed circuit board, is not adjusted, but the position of the screen plate relative to the object is adjusted by adjusting the position of the plate relative to the table.

For example, Japanese Patent Application laid open for opposition, under Publication No. 3(1991)-33109, discloses a screen device which includes a screen plate and a screen-plate frame to which the screen plate is detachably attached. The screen-plate frame is detachably attached to a frame-support table, and the position of the screen-plate frame relative to the frame-support table is adjusted to adjust the position of the screen plate relative to an object to be printed. The frame-support table includes a frame-support portion which can support the screen-plate frame, and a cylinder-retain portion which retains fixing cylinders. In a state in which the screen-plate frame is placed on the frame-support portion of the frame-support table, the frame is pushed against the frame-support portion by the fixing cylinders, and thus is fixed to the table.

The prior screen device additionally employs a lifting means for lifting, when a position adjusting operation is carried out, the screen-plate frame up and thereby lightly moving the frame relative to the table. The screen frame needs to be so large and rigid as to stretch the screen without slack and maintain an appropriate tension of the screen. A unit consisting of the screen plate including the very screen frame, and the screen-plate frame holding the screen plate, is heavy and, when the unit is moved on the frame-support table, a large frictional force is produced between the screen-plate frame and the frame-support table. Accordingly, it is difficult to move the frame on the table, in particular, correct small positional errors of the frame relative to the table.

To solve this problem, the lifting means is operated, when a position adjusting operation is carried out, to lift the frame up from the frame-support portion of the table, thereby reducing the frictional force. One example of the lifting means comprises a plurality of compression coil springs which are provided between the table and the frame and which elastically raise the frame. Another example of the lifting means comprises an air-pressure-type lifting device which supplies a pressurized air to create a space between the frame and the frame-support portion of the table, thereby lifting the frame up from the frame-support portion.

In the case of the compression coil springs, it is difficult to zero the frictional resistance produced between the frame and the table. Although the frame must not contact the frame-support portion nor cylinder-support portion of the table to zero the frictional resistance, the respective elastic forces of the compression coil springs cannot be precisely equal to each other, i.e., may differ from each other, and additionally may timewise change. Therefore, if it is intended to lift surely the frame up from the frame-support portion of the table, the frame may contact the cylinder-support portion of the table that is provided above the frame-support portion. On the other hand, if it is intended to prevent the frame from contacting the cylinder-support portion, it is impossible to separate completely the frame from the frame-support portion. Thus, some frictional resistance remains between the frame and the table, which does not allow the frame to be lightly moved relative to the table. Meanwhile, the air-pressure-type lifting device needs a complex structure and occupies a large space, which leads to increasing the production and running costs of the screen device. These problems with the lifting means are also encountered in the case where no screen-plate frame is employed, that is, the screen plate is directly fixed to the frame-support table after the position of the plate relative to the table is adjusted.

If the screen frame is formed of a light material such as aluminum, the total weight of the frame is reduced. However, the aluminum frame suffers insufficient rigidity, and cannot give the screen an appropriate tension. In addition, if some external force is exerted to the screen plate when a position adjusting operation is carried out, some strain might be produced in the screen frame. To solve this problem, it is needed to employ the screen frame which has a large second moment of area. Thus, the screen frame needs to have a large size and a large weight.

SUMMARY OF THE INVENTION

The present invention provides a screen apparatus that has one or more of the technical features that are described below in respective paragraphs given parenthesized sequential numbers (1) to (13). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed. However, the following technical features and the combinations thereof are just examples to which the present invention is by no means limited.

(1) According to a first feature of the present invention, there is provided a screen apparatus, comprising a screen plate including a screen and a screen frame to which a peripheral portion of the screen is fixed; a frame-support table having a frame-support surface which supports the screen frame of the screen plate; a position adjusting device which is connected to the frame-support table and which adjusts a position of the screen plate relative to the frame-support table in a direction parallel to the screen; a fixing device which, when the position adjusting device adjusts the position of the screen plate, permits the screen plate to be moved relative to the frame-support table and, after the adjustment of the position, presses the screen frame against the frame-support surface of the frame-support table, thereby fixing the screen plate to the frame-support table; at least three balls which are supported by at least one of the screen frame and the frame-support table such that each of the balls is movable between an advanced position thereof and a retracted position thereof; at least three biasing devices each of which supports a corresponding one of the balls such that the one ball is rollable and which biases the one ball toward the advanced position thereof; and at least three advanced-position defining devices which define the respective advanced positions of the balls where the balls cooperate with each other to position the screen frame at a position apart by a predetermined distance from the frame-support surface of the frame-support table. In the present screen apparatus, the position adjusting device may be one which fixes the position of the screen plate relative to the frame-support table such that the relative position is adjustable automatically or manually. The automatic position adjusting device may be provided by a drive source and a positioning member which is automatically moved, by a drive force produced by the drive source, to an adjusted position where the positioning member is to position the screen plate. The manual position adjusting device may be provided by an adjust screw which is connected to the frame-support table and which is manually rotated by an operator to an adjusted position where the adjust screw is to position the screen plate. Positioning the screen plate at the position adjusted by the position adjusting device may be manually carried out by the operator, or automatically carried out by a pushing device which is employed as a portion of the position adjusting device and which is automatically controlled to push the screen plate against the remaining portion of the position adjusting device. The balls, the biasing devices, and the advanced-position defining devices may be supported by the screen frame only, by the frame-support table only, or by both the frame and the table. In the last case, the balls, the biasing devices, and the advanced-position defining devices must not be supported by the frame and the table, such that one or more balls supported by the frame is or are opposed to, i.e., aligned with, one or more balls supported by the table. In the case where the lower surface of the screen frame is covered by the screen, the screen frame is supported on the frame-support surface indirectly via the screen. Meanwhile, in the case where the lower surface of the screen frame is not covered by the screen, the screen frame is directly supported on the frame-support surface. When a position adjusting operation is carried out, the fixing device is not operated to fix the screen plate to the frame-support table, and allows the position adjusting device to adjust the position of the plate relative to the table. When the screen plate is positioned at a position adjusted by the position adjusting device, the screen frame is lightly moved relative to the table owing to the rolling of the balls, since the balls are held at their advanced positions and the frame is supported on the table via the balls and the biasing devices. Subsequently, when the fixing device fixes the frame to the table, the balls are moved to their retracted positions against the respective biasing forces of the biasing devices, thereby allowing the frame to contact the frame-support surface of the table directly, or indirectly via the screen. In the present screen apparatus, when a position adjusting operation is carried out, the balls held at their advanced positions cooperate with one another to keep reliably the screen frame apart from the frame-support surface. In addition, the balls on which the frame is supported are rollable. Thus, the frame is lightly moved and accordingly a small positional error of the frame is easily corrected. Moreover, the frame is moved with a small force. Accordingly, in the case where the position adjusting device is provided by a pushing-utilizing position adjusting device, the pushing means of the position adjusting device may enjoy a small size and a low cost. Furthermore, the present invention is implemented by additionally connecting the balls, the biasing devices, and the advanced-position defining devices to at least one of a screen frame and a frame-support table which are employed by a conventional screen device. Thus, the present screen apparatus is provided with the function of lightly adjusting the position of the screen frame, without needing to change largely the mechanical construction of the conventional screen device. That is, the present screen apparatus is easily obtained by converting a conventional screen device.

(2) According to a second feature of the present invention that includes the first feature (1), the each of the biasing devices comprises a ball retainer which retains the one ball such that the one ball is rollable; and an elastic member which is provided between the ball retainer and the at least one of the screen frame and the frame-support table and which biases the ball retainer toward the other of the screen frame and the frame-support table, thereby biasing the one ball toward the advanced position thereof. The elastic member may be provided by a spring member, such as a compression coil spring according to the seventh feature (7) described below, or by a rubber member. Since each of the balls is retained by the corresponding ball retainer, the each ball is prevented from being out of position relative to the corresponding elastic member. Thus, the each ball is reliably held at its advanced position by the biasing force of the corresponding elastic member.

(3) According to a third feature of the present invention that includes the first or second feature (1) or (2), each of the advanced-position defining devices comprises a cover member which covers an opening of a corresponding one of at least three holes which are formed in the at least one of the screen frame and the frame-support table and which accommodate the balls, respectively, the cover member permitting the ball accommodated in the one hole to be biased toward the advanced position thereof where a portion of the ball projects into a space outside the cover member. Since each of the cover members covers the opening of the corresponding hole, dust or the like does not enter the hole. In addition, the advanced-position defining devices are obtained easily and at low cost. In the state in which the screen plate is supported by the frame-support table via the balls and the biasing devices, the balls are kept in contact with the cover members, respectively. Accordingly, it is preferred that respective contact surfaces of the cover members to contact the balls are formed of a material having a low friction coefficient.

(4) According to a fourth feature of the present invention that includes the third feature (3), the holes are formed in the frame-support table, and the cover member of the each of the advanced-position defining devices is fixed to the frame-support table, such that the cover member is entirely accommodated in a corresponding one of at least three counterbores formed in the frame-support surface of the frame-support table. In the present screen apparatus, the balls are accommodated in the holes formed in the frame-support table. This manner costs lower than the manner in which the balls are accommodated in the holes formed in the screen frame, because a single frame-support table can be commonly used with a plurality of screen frames. More specifically described, the balls retained by the single frame-support table can be commonly used to position each of the plurality of screen frames at a position apart from the frame-support surface. In contrast, the balls retained by each of the plurality of screen frames are only used to position that screen frame at a position apart from the frame-support surface. In addition, in the present screen apparatus, each of the cover members is entirely accommodated in the corresponding counterbore formed in the frame-support surface. Accordingly, it is not needed to form, in the lower surface of the screen frame, holes for receiving the cover members, when the frame contacts the frame-support surface. The cover members do not interfere with the frame when the frame contacts the frame-support surface.

(5) According to a fifth feature of the present invention that includes any one of the second to fourth features (2) to (4), the ball retainer of the each of the biasing devices is fitted in a corresponding one of at least three holes which are formed in the at least one of the screen frame and the frame-support table and which accommodate the balls, respectively, the ball retainer being movable in the one hole in a direction of depth thereof, the ball retainer having, in a central portion thereof, a hole which permits a portion of the ball accommodated in the one hole to be fitted therein. The hole of each of the ball retainers may be a blind hole having a bottom, or a through-hole which is formed through the thickness of the central portion of the each ball retainer, according to the sixth feature (6) described below, and has no bottom.

(6) According to a sixth feature of the present invention that includes the fifth feature (5), the ball retainer comprises a circular plate member having a central hole formed through a thickness of the central portion thereof. It is preferred that a surface of each of the circular plate members that defines the central hole thereof is defined by a portion of a semi-spherical concave surface and that the surface of the each plate member can entirely contact the corresponding ball.

(7) According to a seventh feature of the present invention that includes any one of the second to sixth features (2) to (6), the elastic member comprises a compression coil spring. In the state in which the balls are held at their advanced positions, each of the compression coil springs is kept in a compressed state in which the each spring can bear a preset load somewhat greater than the load applied from the screen frame to the corresponding ball.

(8) According to an eighth feature of the present invention that includes any one of the second to seventh features (2) to (7), the ball retainer and the elastic member are provided by an integral member. In the present screen apparatus, the total number of the parts needed to produce the apparatus is reduced, and the assembling of the apparatus is facilitated.

(9) According to a ninth feature of the present invention that includes the first feature (1), each of the balls, a corresponding one of the biasing devices, and a corresponding one of the advanced-position defining devices are provided by a corresponding one of at least three ball units, and each of the ball units is held in a corresponding one of at least three unit-hold holes formed in the at least one of the screen frame and the frame-support table. In the present screen apparatus, each of the ball units may be one which cannot maintain its assembled state outside the corresponding unit-hold hole. However, it is preferred that each of the ball units is one which can maintain its assembled state not only inside, but also outside, the corresponding unit-hold hole. In the latter case, each of the balls, a corresponding one of the biasing devices, and a corresponding one of the advanced-position defining devices may be assembled into a sub-assembly in advance. This contributes to facilitating the administration of parts and/or the assembling of parts. The ball units according to the ninth feature (9) may include any one of the second to eighth features (2) to (8).

(10) According to a tenth feature of the present invention that includes the ninth feature (9), the each of the ball units comprises a ball case which retains a corresponding one of the balls such that the one ball is rollable, a portion of the one ball projects into a space outside the ball case, and the one ball is not separable from the ball case, the biasing device of the each ball unit comprising the ball case and an elastic member which biases the ball case. If each of the balls is accommodated in the corresponding ball case, foreign matters can be easily prevented from entering the ball case through the interface between the each ball and the ball case. Thus, the each ball can maintain its light rolling for a long period.

(11) According to an eleventh feature of the present invention that includes the tenth feature (10), the ball case has a semi-spherical concave bottom surface which supports the one ball, via a plurality of round members each of which has a diameter smaller than a diameter of the one ball, such that the one ball is rollable. Since each of the balls is supported by the concave bottom surface via the small round members, the each ball can more lightly roll than is supported directly by the concave bottom surface. When the each ball rolls indirectly via the small round members, only rolling friction is produced; and when the each ball rolls directly on the concave bottom surface, sliding friction is produced that is much greater than the rolling friction. Thus, in the present screen apparatus, the screen plate is more lightly moved relative to the frame-support table.

(12) According to a twelfth feature of the present invention that includes the tenth or eleventh feature (10) or (11), the each of the ball units further comprises a unit case which accommodates the ball case such that the ball case is movable relative to the unit case, the elastic member being provided between the unit case and the ball case, the unit case having a stopper which defines a limit of movement of the ball case caused by a biasing force of the elastic member, the advanced-position defining device of the each ball unit comprising the stopper. In the present screen apparatus, each of the balls, a corresponding one of the ball cases, and a corresponding one of the elastic members are assembled in a corresponding of the unit cases, to provide a corresponding one of the ball units each of which can maintain its assembled state not only inside, but also outside, a corresponding one of the unit-hold holes formed in at least one of the screen frame and the frame-support table.

(13) According to a thirteenth feature of the present invention, there is provided a screen apparatus, comprising a screen plate including a screen and a screen frame to which a peripheral portion of the screen is fixed; a screen-plate frame which holds the screen plate such that the screen plate is detachable therefrom; a frame-support table having a frame-support surface which supports the screen-plate frame; a position adjusting device which is connected to the frame-support table and which adjusts a position of the screen-plate frame relative to the frame-support table in a direction parallel to the screen; a fixing device which, when the position adjusting device adjusts the position of the screen-plate frame, permits the screen-plate frame to be moved relative to the frame-support table and, after the adjustment of the position, presses the screen-plate frame against the frame-support surface of the frame-support table, thereby fixing the screen-plate frame to the frame-support table; at least three balls which are supported by at least one of the screen-plate frame and the frame-support table such that each of the balls is movable between an advanced position thereof and a retracted position thereof; at least three biasing devices each of which supports a corresponding one of the balls such that the one ball is rollable and which biases the one ball toward the advanced position thereof; and at least three advanced-position defining devices which define the respective advanced positions of the balls where the balls cooperate with each other to position the screen-plate frame at a position apart by a predetermined distance from the frame-support surface of the frame-support table. The screen-plate frame which holds the screen plate is fixed to the frame-support table, and the position of the frame relative to the table is adjusted, like the screen plate of the screen apparatus according to the first feature (1). Thus, the position of the screen plate held by the frame relative to the table is adjusted. The screen apparatus according to the thirteenth feature (13) enjoys the same advantages as those of the screen apparatus according to the first feature (1). The screen apparatus according to the thirteenth feature (13) may include any one of the second to twelfth features (2) to (12).

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Figure 1:
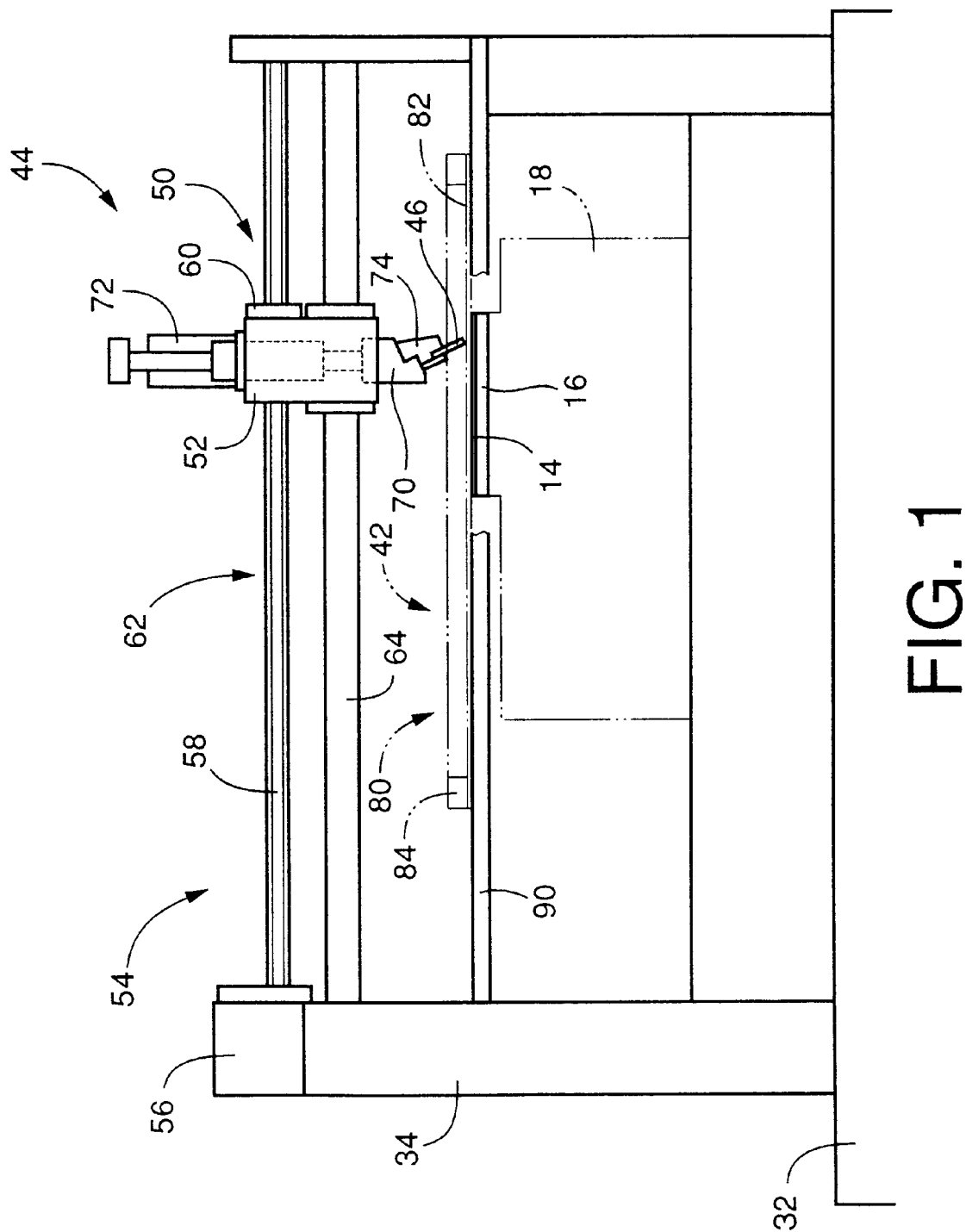
FIG. 1 is a schematic front elevation view of a screen printing machine including a screen device to which the present invention is applied.

Referring first to FIGS. 1 to 4, 5A, and 5B, there will be described a screen printing machine including a screen device 42 to which the present invention is applied.

A board conveying device (not shown) conveys, to the screen printing machine, a printed circuit board 14 as an object on which a print material is to be printed by the printing machine. The circuit board 14 is positioned and supported by a board positioning and supporting device 16 and, in that state, is elevated and lowered by a board elevating and lowering device 18, so that the circuit board 14 is contacted with, and separated from, a screen 82 of a screen plate 80 which will be described later. Thus, the board elevating and lowering device 18 provides a board contacting and separating device which moves the circuit board 14 relative to the screen 82 so that the board 14 is contacted with, and separated from, the screen 82.

The screen device 42 and a squeegee device 44 are supported by a main frame 34 which is provided on a bed 32 of the screen printing machine. The squeegee device 44 includes a squeegee 46 and a squeegee moving device 50 which moves the squeegee 46 relative to the circuit board 14 and the screen plate 80. The squeegee moving device 50 includes a movable member 52 and a movable-member moving device 54. The movable-member moving device 54 includes a servomotor 56 as a sort of electric motor as a drive source, and a motion converting device 62 which includes a feed screw 58 and a nut 60 and converts the rotation of the servomotor 56 into a linear movement of the movable member 52. Thus, the movable member 52 is moved by the moving device 54, while being guided by a guide rod 64.

The movable member 52 supports an elevator member 70 such that the elevator member 70 can be elevated and lowered, and an elevating and lowering device 72 which elevates and lowers the elevator member 70 relative to the movable member 52. A squeegee holder 74 which holds the squeegee 46 is detachably attached to the elevator member 70. When the elevator member 70 is elevated and lowered, the squeegee 46 is contacted with, and separated from, the screen 82. Thus, the elevator member 70 and the elevating and lowering device 72 provide a squeegee contacting and separating device which moves the squeegee 46 relative to the screen 82 so that the squeegee 46 is contacted with, and separated from, the screen 80. As described above, the squeegee 46 is moved on the screen 20 when the movable member 52 is moved by the movable-member moving device 54.

Figure 2:
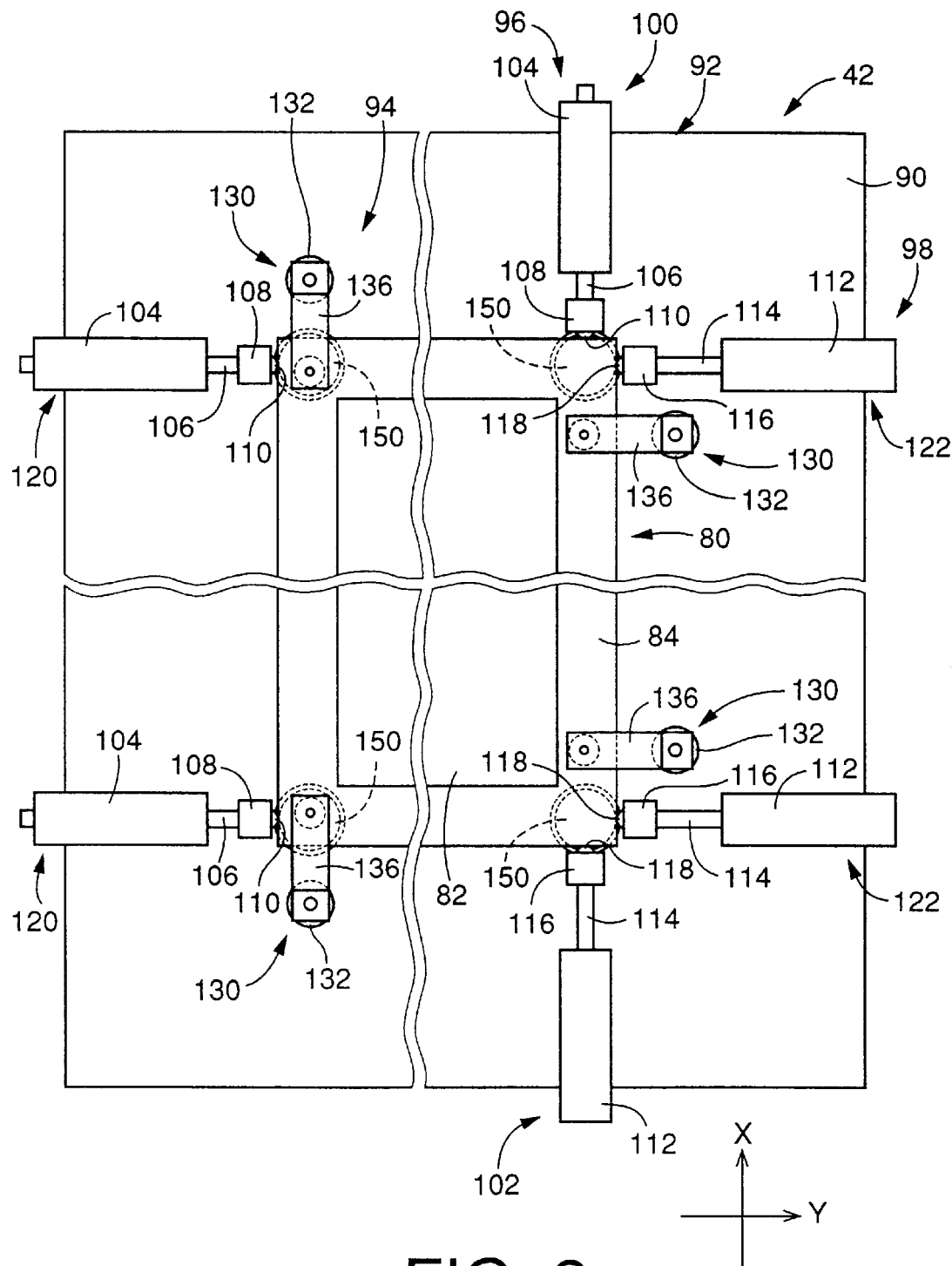
FIG. 2 is a plan view of the screen device of FIG. 1.

The screen device 42 includes the screen plate 80. As shown in FIGS. 1 and 2, the screen plate 80 includes the screen 82 and a screen frame 84 to which a peripheral portion of the screen 82 is fixed. The screen 82 has a plurality of print holes (not shown) which are formed through the thickness of the screen 82 at respective positions corresponding to a plurality of print spots on the circuit board 14 where a creamed solder as the print material is to be printed. The screen 82 is fixed to the screen frame 84, such that the screen 82 is free of slack and has a necessary tension and such that the screen 82 covers a lower surface of the screen frame 84.

The screen plate 80 is detachably attached to a frame-support table 90 supported by the main frame 34, such that the screen frame 84 is supported on the frame-support table 90. The frame-support table 90 has a rectangular shape with a rectangular central window through which the circuit board 14 is contacted with, and separated from, the screen 82 of the screen plate 80 attached to the frame-support table 90. In this state, the screen 82 extends along a horizontal plane.

As shown in FIG. 2, the frame-support table 90 is provided with a pushing-utilizing position adjusting device 92 and a fixing device 94. The pushing-utilizing position adjusting device 92 includes a pushing-utilizing X-direction position adjusting device 96 which adjusts a position of the screen plate 80 relative to the frame-support table 90 in an X direction parallel to a direction in which the circuit board 14 is conveyed; and a pushing-utilizing Y-direction position adjusting device 98 which adjusts a position of the screen plate 80 relative to the frame-support table 90 in a Y direction perpendicular to the X direction on a horizontal plane.

The pushing-utilizing X-direction position adjusting device 96 includes an X-direction position adjusting device 100 and an X-direction pushing device 102. The X-direction position adjusting device 100 includes a position adjusting electrically operated cylinder 104. The electric cylinder 104 includes a housing; a nut (not shown) which is provided in the housing such that the nut is rotatable about its axis line but is not movable in its axial direction; a ball screw 106 which is screwed in, and engaged with, the nut and which is movable in its axial direction but is not rotatable relative to the housing; and a servomotor (not shown) as a sort of electric motor as a drive source that rotates the nut. When the nut is rotated by the servomotor, the ball screw 106 is advanced and retracted in opposite directions parallel to the X direction. The servomotor can be controlled with high accuracy with respect to rotation angle and rotation speed.

A head 108 is provided at one of opposite ends of the ball screw 106 that project from the housing of the electric cylinder 104. The head 108 supports a roller 110 such that the roller 110 is rotatable about its vertical axis line perpendicular to the plane of the frame-support table 90, and such that a radially outer portion of the roller 110 partly projects from the head 108. When the screen plate 80 is attached to the frame-support table 90, first, the screen frame 84 is butted against the head 108 or the roller 110 and is thus positioned in the X direction. When the ball screw 106 is advanced or retracted by the servomotor, the head 108 is moved to a position where the screen plate 80 is positioned. Thus, the position of the screen plate 80 relative to the frame-support table 90 in the X direction is adjusted.

The X-direction pushing device 102 includes a pushing cylinder 112 which is opposed to the X-direction position adjusting device 100 in the X direction and which is provided by an air-pressure-operated cylinder as a sort of fluid-pressure-operated cylinder. A head 116 is provided at one of opposite ends of a piston rod 114 that projects from a housing of the pushing cylinder 112, and the head 116 supports a roller 118 such that the roller 118 is rotatable about its vertical axis line and such that a radially outer portion of the roller 118 partly projects from the head 116.

The Y-direction pushing-utilizing position adjusting device 98 includes two Y-direction position adjusting devices 120 and two Y-direction pushing devices 122. Each of the two Y-direction position adjusting devices 120 has the same structure as that of the X-direction position adjusting device 100, and each of the two Y-direction pushing devices 122 has the same structure as that of the X-direction pushing device 102. The same reference numerals as used for the devices 100, 102 are used to designate corresponding elements or parts of the devices 120, 122, and the description thereof is omitted. The two Y-direction position adjusting devices 120 are provided on the frame-support table 90 at respective places distant from each other in the X direction, and the two Y-direction pushing devices 122 are also provided on the frame-support table 90 at respective places distant from each other in the X direction, such that the two pushing devices 122 are opposed to the two position adjusting devices 120, respectively, in the Y direction.

Figure 3:
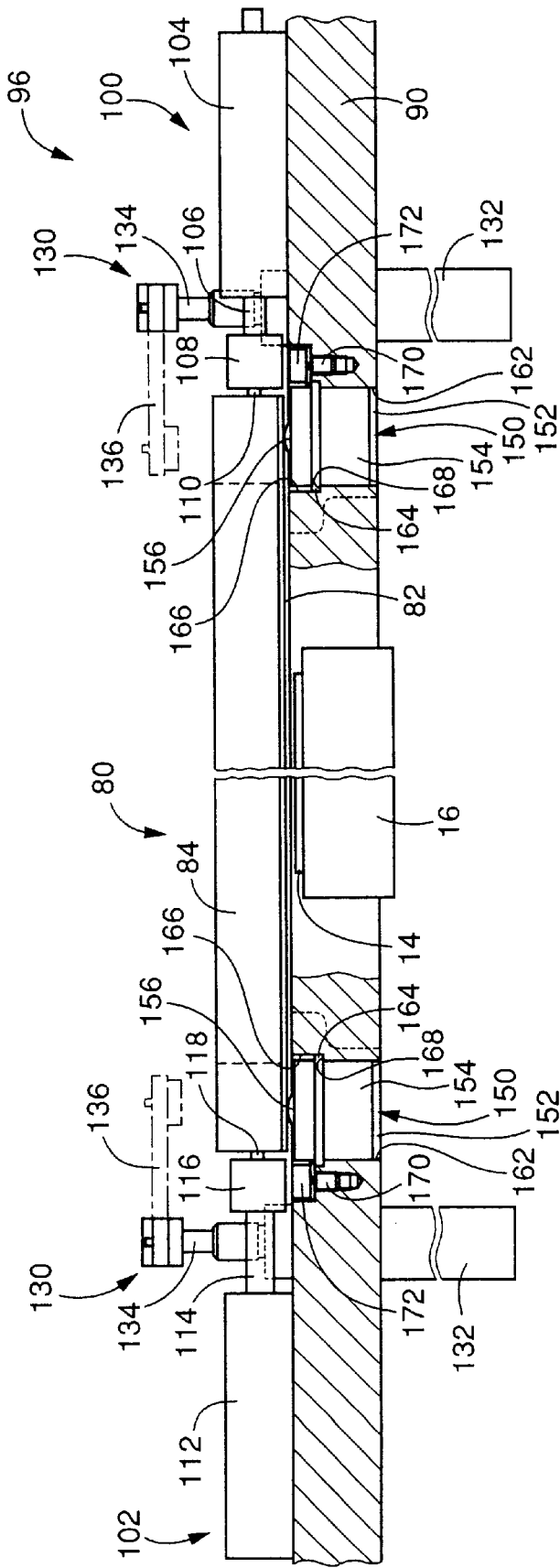
FIG. 3 is a cross-sectioned, front elevation view of the screen device of FIG. 2, taken along a vertical plane passing through ball units of the screen device.

The fixing device 94 includes four clamp units 130 which are provided on the frame-support table 90 at respective positions corresponding to the four corners of the screen frame 84. Since the four clamp units 130 have a same structure, one of the four units 130 will be described below as a representative thereof. One clamp unit 130 includes a clamping cylinder 132 which is oriented in a vertical direction perpendicular to the plane of the frame-support table 90 and which is provided by an air-pressure-operated cylinder as a sort of fluid-pressure-operated cylinder. As shown in FIG. 3, an axis member 134 is attached to a piston rod of the clamping cylinder 132, and a clamp arm 136 extends from one end of the axis member 134 in a direction perpendicular to an axis line of the axis member 134.

When the piston rod of the clamping cylinder 132 is advanced and retracted, the axis member 134 is advanced and retracted, and/or rotated. More specifically described, when the piston rod is advanced or retracted over a predetermined portion of its entire stroke, the arm axis 134 is rotated about its axis line. The axis member 134 has a cam groove formed in an outer circumferential surface thereof. The cam groove includes a straight portion extending parallel to the axis line of the axis member 134, that is, extending in the axial direction of the axis member 134, and an inclined portion extending with an inclination with respect to the axis line. A pin as a cam follower is tightly fitted in a hole formed in a guide member (not shown) which guides the axial-direction movement and rotation of the axis member 134. Therefore, when the piston rod is advanced or retracted and accordingly the axis member 134 is advanced or retracted, the pin is moved in the cam groove (in fact, the cam groove is moved relative to the pin). While the pin is moved in the straight portion of the cam groove, the axis member 134 is moved in its axial direction but is not rotated about its axis line; and while the pin is moved in the inclined portion, the axis member 134 is moved in its axial direction while being rotated. The axis member 134 is advanced and rotated to its advanced-end position, shown in FIG. 5A, where the axis member 134 takes a first predetermined rotation position, and is retracted and rotated to its retracted-end position, shown in FIG. 5B, where the axis member 134 takes a second predetermined rotation position. When the axis member 134 is advanced or retracted and/or rotated, the clamp arm 136 is also advanced or retracted parallel to the axis line of the axis member 134, and/or rotated about that axis line. The clamp arm 136 is advanced and rotated to its permitting position, shown in FIG. 5A, where the clamp arm 136 is separate from the screen frame 84 in a direction parallel to the direction of thickness of the same 84 and permits the screen plate 80 to be moved relative to the frame-support table 90, and is retracted and rotated to its fixing position, shown in FIG. 5B, where the clamp arm 136 presses the screen frame 84 against the frame-support table 90, thereby fixing the frame 84 to the table 90. The fixing position of the clamp arm 136 can be said as its operative position above the screen frame 84, and the permitting position of the same 136 can be said as its inoperative position away from the screen frame 84.

When the axis member 134 takes its advanced-end position, the axis member 134 takes its first rotation position. In this state, the clamp arm 136 takes its permitting position and its inoperative position. Meanwhile, when the axis axis member 134 takes its retracted-end position, the axis member 134 takes its second rotation position. In this state, the clamp arm 136 takes its fixing position and its operative position. The cam groove formed in the axis member 134 is designed such that when the axis member 134 is retracted from its advanced-end position, the axis member 134 is rotated during an initial period following the beginning of retraction, so that the clamp arm 136 is rotated from its inoperative position to its operative position while being moved from its permitting position to its fixing position, and so that the clamp arm 136 reaches its operative position before contacting the screen frame 84, then contacts the screen frame 84 after having stopped rotating, and further approaches the frame-support table 90. On the contrary, when the axis member 134 is advanced from its retracted-end position toward its advanced-end position, the axis member 134 is not rotated but is moved from its fixing position toward its permitting position away from the screen frame 84, during an initial period following the beginning of advancement. Then, the clamp arm 136 is rotated from its operative position to its inoperative position while being moved away from the screen frame 84. The position adjusting cylinder 104, the pushing cylinder 112, and the clamping cylinders 132 are automatically controlled by a control device (not shown) which also controls the board elevating and lowering device 18, etc.

As shown in FIG. 2, the frame-support table 90 is provided with four ball units 150 at respective positions corresponding to the four corners of the screen frame 84. Since the four ball units 150 has a same structure, one of the four units 150 will be described below as a representative thereof.

Figure 4:
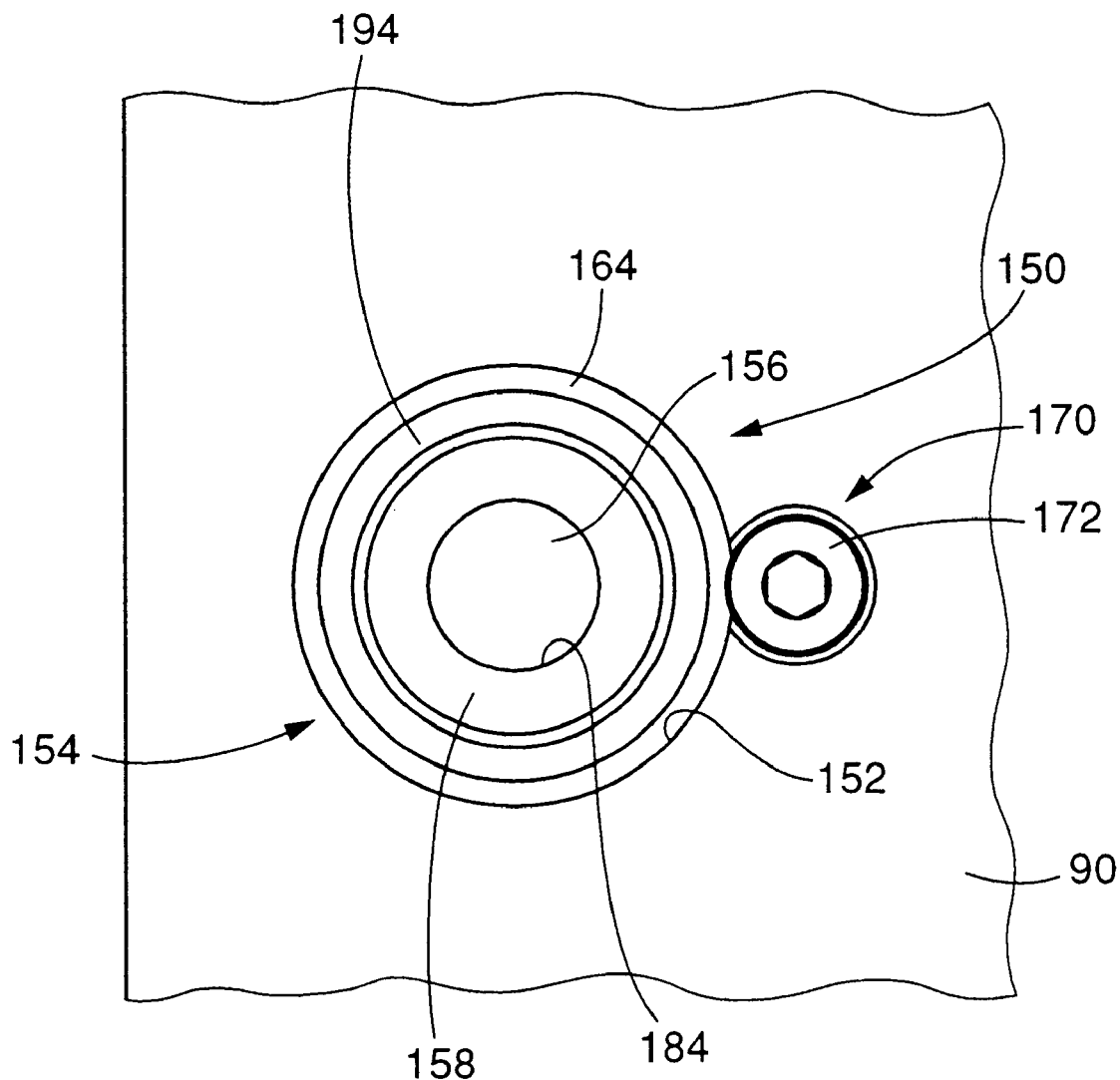
FIG. 4 is a plan view of one of the ball units of FIG. 3.

The frame-support table 90 has four unit-hold holes 152 at respective positions corresponding to the four corners of the screen frame 84. Each of the four unit-hold holes 152 has a circular cross section and is formed through the thickness of the table 90. Two holes 152 out of the four holes 152 are shown in FIG. 3. The four ball units 150 are fitted in, and held by, the four unit-hold holes 152, respectively. As shown in FIGS. 4 and 5, each one of the ball units 150 includes a cylindrical unit case 154, and a ball 156, a ball case 158 as a ball retainer, and a compression coil spring 160 as an elastic member which are assembled in the unit case 154. Each one of the four unit-hold holes 152 has a stepped shape, i.e., includes a small-diameter portion 162 and a large-diameter portion 166. The unit case 154 is fitted in the small-diameter portion 162, such that a flange 164 extending radially outwardly from an axially intermediate portion of the unit case 154 is supported on a bottom surface 168 of the large-diameter portion 166. The flange 164 is provided at a position somewhat higher than the axially middle portion of the unit case 154. The ball unit 150 is fastened by a screw 170 which is screwed in the frame-support table 0, such that the flange 164 of the unit case 154 is sandwiched between a head portion 172 of the screw 170 and the bottom surface 168 of the large-diameter portion 166. Thus, the unit case 154 or the ball unit 150 is prevented from coming off the unit-hold hole 152. The flange 164, the bottom surface 168, and the screw 170 cooperate with one another to provide a unit-coming-off preventing device.

The ball case 158 is easily manufactured by assembling a first member 176 and a second member 178 into the integral member, i.e., the integral ball case 158. As shown in FIG. 4, the ball case 158 has a circular cross section. The ball case 158 is accommodated in the unit case 154 such that the ball case 158 is slideable on an inner circumferential surface of the unit case 154. The ball case 158 has a semi-spherical concave bottom surface 180 which supports the ball 156, via a number of small round members 182 whose diameter is smaller than that of the ball 156, such that the ball 156 is rollable. As shown in FIGS. 4 and 5, the ball case 158 has an opening 184 which is defined by a portion of a semi-spherical concave surface. The ball case 158 retains the ball 156 such that a portion of the ball 156 projects into an outside space through the opening 184 but is not separable from the ball case 158. The ball 156 is held in contact with the concave surface defining the opening 184, such that the ball 156 is rollable. Since the ball case 158 is movable in the unit case 154, the ball 156 is movable between its advanced position and its retracted position.

The compression coil spring 160 is provided between the ball case 158 and the unit case 154, and biases the ball case 158 toward the screen frame 184, thereby biasing the ball 156 toward its advanced position. Thus, the ball case 158 and the coil spring 160 cooperate with each other to provide a biasing device 192. The limit of movement of the ball case 158 caused by a biasing force of the coil spring 160 is defined by butting of the ball case 158 against an inner flange 194 projecting radially inwardly from one of axially opposite ends of the unit case 154 that is nearer to the screen frame 84. Thus, the advanced position of the ball 156 is defined such that the ball 156 held at its advanced position projects upwardly and intersects a plane passing through a flat frame-support surface 190 of the frame-support table 90 that supports the screen frame 84 via the screen 82. The four balls 156 held at their advanced positions cooperate with one another to position the screen frame 84 at a position apart by a predetermined distance from the frame-support surface 190. The inner flange 194 provides a ball-case stopper, or a ball-advanced-position defining device. In the state in which the ball case 158 is held in butting contact with the inner flange 194 of the unit case 154 and the ball 156 is held at its advanced position, the compression coil spring 160 is kept in a compressed state in which the coil spring 160 can bear a preset load somewhat greater than a load which is applied by the screen plate 80 to the ball 156. Meanwhile, the retracted position of the ball 156 is defined such that the upper end of the ball 156 held at its retracted position is positioned on the plane passing through the frame-support surface 190, that is, is aligned with the surface 190, and accordingly such that the ball 156 held at its retracted position permits the screen frame 84 to contact the frame-support surface 190 via the screen 82.

Before the application of the creamed solder to the circuit board 14, that is, the printing of the solder onto the board 14 is started, the screen plate 80 is attached to the frame-support table 90. When the plate 80 is attached to the table 90, respective positions of the plate 80 relative to the table 90 in the X and Y directions each parallel to the screen 82, are adjusted, whereby respective positions of the plate 80 relative to the circuit board 14 are adjusted. This is achieved in the present embodiment in such a manner that respective images of a plurality of indicias provided on the circuit board 14 are taken by an image taking device (not shown), respective images of a plurality of indicias provided on the screen 82 are taken by the same image taking device, respective positional errors of the plate 80 relative to the board 14 in the X and Y directions are calculated, and then the plate 80 is moved relative to the table 90 in the X and Y directions so as to eliminate the calculated positional errors. As far as the present embodiment is concerned, it is assumed that one position adjusting operation is carried out for one screen plate 80, that is, for the first one of a plurality of circuit boards 14 on each of which the creamed solder is applied using the one screen plate 80. Each of the circuit boards 14 is positioned and supported by the board positioning and supporting device 16, when the creamed solder is applied to the circuit board 14. Therefore, once the positions of the screen plate 80 relative to the first circuit board 14 are adjusted, it can be said that the positions of the screen plate 80 relative to each of the second and following circuit boards 14 are adjusted.

Figure 5A:
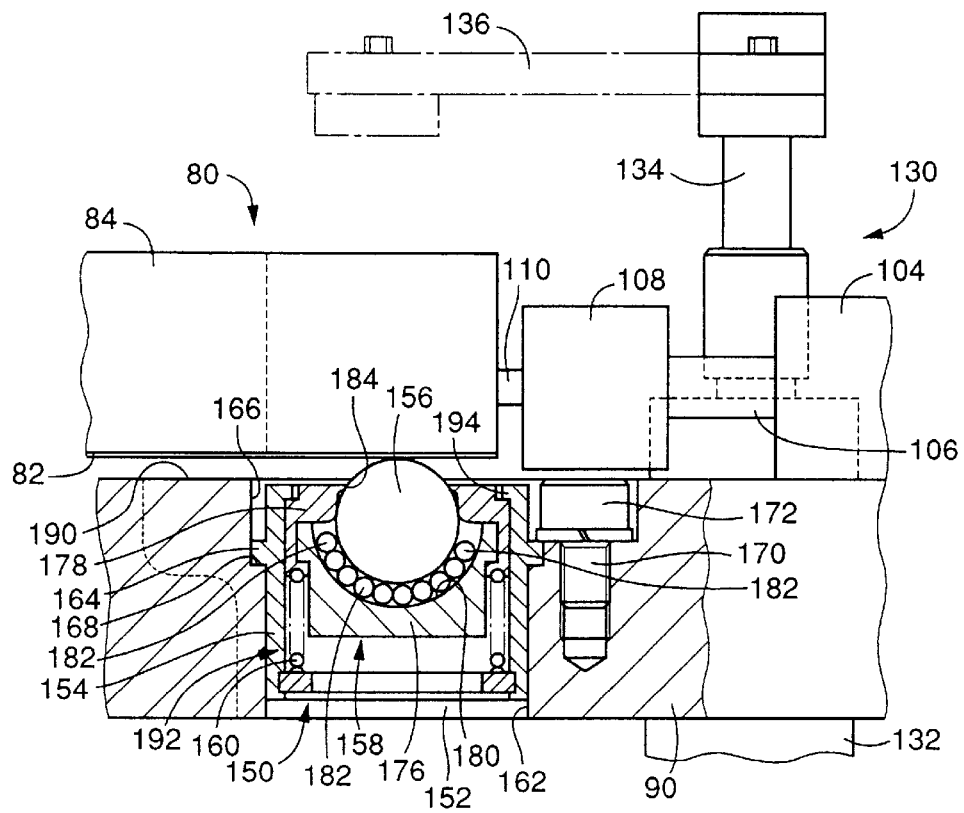
FIG. 5A is a cross-sectioned, front elevation view of one of the ball units of FIG. 3, showing a ball at its advanced position.

When the position adjusting operation is carried out, the circuit board 14 is positioned and supported by the board positioning and supporting device 16, such that the board 14 is positioned at a position apart from the screen plate 80 or the screen 82. An operator or worker places, on the frame-support surface 190 of the frame-support table 90, the screen plate 80 to be used in carrying out the screen printing operation. In this state, none of the X-direction pushing device 102 and the two Y-direction pushing devices 122 are being operated to press the screen plate 80, nor the fixing device 94 is being operated to fix the plate 80 to the table 90. That is, the respective clamp arms 136 of the four clamp units 130 of the fixing device 94 are held at their permitting positions and their inoperative positions, and accordingly the fixing device 94 is held in its state in which the fixing device 94 permits the plate 80 to be moved relative to the table 90. More specifically described, as shown in FIG. 5A, the ball case 158 is held in contact with the inner flange 194 of the unit case 154 because of the biasing force of the compression coil spring 160, and the ball 156 is held at its advanced position. The worker can place, without being interfered with by the clamp arms 136, the screen plate 80 on the frame-support table 90, i.e., place the screen frame 84 on the four balls 156. That is, the table 90 supports the frame 84 via the balls 156 and the springs 160. Each of the springs 160 is kept in a compressed state even in the state in which a corresponding one of the balls 156 is held at its advanced position, and in that compressed state the each spring 160 can bear a preset load somewhat greater than the load applied from the frame 84 to the one ball 156. Therefore, the ball case 158 is held in contact with the inner flange 194 of the unit case 154, so that the frame 84 is accurately separated from the frame-support surface 190 by the four balls 156 held at their advanced positions.

After the worker places the screen plate 80 on the frame-support table 90 (or the balls 156), the respective pushing cylinders 112 of the X-direction pushing device 102 and the two Y-direction pushing devices 122 are operated, so that the screen plate 84 is pressed against the respective rollers 110 supported by the respective heads 108 of the respective ball screws 106 of the X-direction position adjusting device 100 and the two Y-direction position adjusting devices 120.

In the above-indicated state, the image taking device (not shown) enters a space between the circuit board 14 and the screen plate 80, and takes respective images of the indicias affixed to the board 14 and respective images of the indicias affixed to the screen 82. The indicias of the board 14 include two indicias provided on one of two diagonals of the board 14, and the indicias of the plate 80 include two indicias provided on one of two diagonals of the plate 80. The control device (not shown) that is also connected to the image taking device calculates, based on image data representing the taken images, respective positional errors of the screen plate 80 relative to the circuit board 14 in the X and Y directions, and calculates respective positions of the plate 80 in the X and Y directions where the plate 80 is positioned relative to the table 90 by the X-direction position adjusting device 100 and the two Y-direction position adjusting devices 120 without any positional errors of the plate 80 relative to the board 14.

Subsequently, the X-direction pushing device 102 and the two Y-direction pushing devices 122 stop pushing the screen plate 80 and then the respective position adjusting cylinders 104 of the X-direction position adjusting device 100 and the two Y-direction position adjusting devices 120 are operated to move the respective heads 108 to respective positions where the screen plate 80 is to be positioned relative to the circuit board 14 without any positional errors in the X and Y directions. Thereafter, the respective pushing cylinders 112 of the X-direction pushing device 102 and the two Y-direction pushing devices 122 are operated to push the screen frame 84 or the screen plate 80, so that the plate 80 is moved relative to the frame-support table 90 in the X and Y directions, and is pushed against the respective rollers 110 of the respective heads 108 of the X-direction position adjusting device 100 and the two Y-direction position adjusting devices 120. That is, the screen plate 80 is positioned at the respective positions defined by the X-direction position adjusting device 100 and the Y-direction position adjusting devices 120. Thus, the position of the plate 80 relative to the table 90 is adjusted. Since the circuit board 14 and the frame-support table 90 are provided on the bed 32 and the main frame 34, respectively, which are not movable relative to each other, positional errors of the screen plate 80 relative to the circuit board 14 can be corrected by adjusting the position of the screen plate 80 relative to the frame-support table 90.

When the position of the screen plate 80 relative to the frame-support table 90 is adjusted in this way, the fixing device 94 is held in the state in which the fixing device 94 permits the plate 80 to be moved relative to the table 90, and the four balls 156 are held at their advanced positions. Therefore, the screen frame 84 placed on the balls 156 is apart from the frame-support surface 190 of the table 90. When the pushing cylinders 112 push the screen frame 184 to move the screen plate 80, the balls 156 are rolled and accordingly the frame 84 is lightly moved relative to the table 90. In particular, since each of the four balls 156 is rollably supported by the ball case 158 via the small round members 182, the each ball 156 is so easily rolled and the plate 80 is so lightly moved relative to the table 90. In addition, since the screen plate 80 can be pushed with a small force, the pushing cylinders 112 may be of a small size and of a low price. Moreover, since the respective heads 108, 116 of the position adjusting cylinders 104 and the pushing cylinders 112 butt against the screen frame 84 via the respective rollers 110, 118, the frame 84 can be moved with reduced frictional resistance while the rollers 110, 118 are rolled. The advantages that the plate 80 is lightly moved on the balls 156 and the frictional resistance produced between the plate 80 and the cylinders 104, 112 is reduced owing to the rollers 110, 118, are likewise obtained when the plate 80 is pushed, before the image taking device takes respective images of the indicias, by the X-direction pushing device 102 and the Y-direction pushing devices 122, so as to be positioned at respective positions defined by the X-direction position adjusting device 110 and the Y-direction position adjusting devices 120.

Figure 5B:
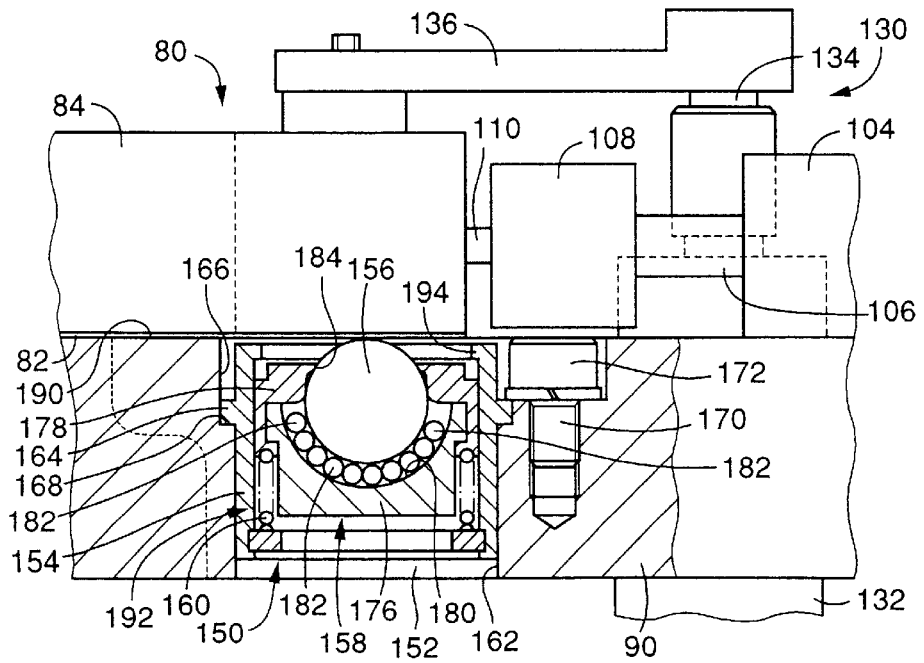
FIG. 5B is a cross-sectioned, front elevation view of the one ball unit of FIG. 5A, showing the ball at its retracted position.

After the position of the screen plate 80 relative to the frame-support table 90 is adjusted, the respective clamp cylinders 132 of the four clamp units 130 are operated to retract the respective axis members 134, so that the respective clamp arms 136 are rotated to their operative position and their fixing positions and are brought into contact with the screen frame 84. In this state, the axis members 134 are further retracted and, as shown in FIG. 5B, the clamp arms 136 push the screen frame 84 against the frame-support surface 190, so that the plate 80 is fixed to the table 90. Consequently the four balls 156 are pushed downward by the screen frame 84, the four ball cases 158 are moved downward against the respective biasing forces of the compression coil springs 160, so that the balls 156 are moved to their retracted positions where the respective upper ends of the balls 156 are aligned with the plane on which the frame-support surface 190 extends, the balls 156 are substantially entirely accommodated in the unit case 154, and the balls 156 permit the frame 84 to contact the frame-support surface 190. Meanwhile, it is possible that after the position of the screen plate 80 is adjusted and before the plate 80 is fixed to the frame-support table 90, the image taking device may be operated again to take respective images of the indicias of each of the circuit board 14 and the screen 82. In the latter case, if the plate 80 has any positional errors relative to the table 90, the position of the plate 80 is adjusted again.

Each of the ball units 150 is constructed such that the ball case 158 is movable together with the ball 156 while retaining the ball 156 such that the ball 156 is held in contact with the concave surface defining the opening 184 of the case 158, irrespective of whether the ball 156 takes its advanced or retracted position, as shown in FIGS. 5A and 5B. Thus, dust or the like is prevented from entering the interface between the ball 156 and the ball case 158, and accordingly the light rolling of the ball 156 is maintained for a long time.

After the position of the screen plate 80 relative to the frame-support table 90 is adjusted and the plate 80 is fixed to the table 90, the circuit board 14 is elevated to contact the screen 82, and the squeegee 46 is moved on the screen 82 to squeeze the creamed solder as the print material placed on the screen 82 so as to force the solder into the print holes formed in the screen 82 and thereby print the solder onto the print spots on the circuit board 14. Since the position of the plate 80 relative to the table 90 has been adjusted, that is, the positional errors of the screen 82 relative to the board 14 have been corrected, the solder is accurately printed on the print spots on the board 14.

Next, there will be described a second embodiment of the present invention by reference to FIGS. 6A and 6B. The second embodiment relates to a screen device 198 which can be used in place of the screen device 42 in the screen printing machine shown in FIG. 1.

The screen device 198 includes a frame-support table 200 having a frame-support surface 202 which contacts and supports the screen frame 84. The frame-support table 200 has four holes 204 at respective positions corresponding to the four corners of the frame 84. Each of the four holes 204 has a circular cross section and is formed in the frame-support surface 202. Four ball retainers 206 are fitted in the four holes 204, respectively, such that each of the retainers 206 is movable in a direction of depth of a corresponding one of the holes 204, that is, in an axial direction of the one hole 204. Each of the ball retainers 206 is provided by a circular plate member having a central hole 208 formed through the thickness of a central portion thereof. A ball 210 is partly fitted in the central hole 208 of the retainer 206, such that the ball 210 is rollable. The central hole 208 is a sort of a recess in which a portion of the ball 210 is fitted. The central hole 208 is defined by a portion of a semi-spherical concave surface that is formed in the retainer 206. The ball 210 can contact the retainer 208 via that portion of the concave surface. That is, the ball 210 is supported on the ball retainer 206, and the ball 210 and the retainer 206 are accommodated in the hole 204 such that the ball 210 is movable between its advanced position and its retracted position. The ball retainer 206 is biased toward by the screen frame 84 by a compression coil spring 212 as an elastic member provided between the retainer 206 and a bottom surface of the hole 204, so that the ball 210 is biased toward its advanced position. The coil spring 212 and the ball retainer 206 cooperate with each other to provide a biasing device 214.

A counterbore 220 is formed around an upper opening of each of the four holes 204, and a cover member 222 is fixed to a bottom surface of the counterbore 220 such that the cover member 222 is entirely accommodated in the counterbore 220. Each of the four cover members 222 is provided by a plate member having a rectangular cross section. Each of the four cover members 222 is fitted in a corresponding one of the four counterbores 220, and is fixed to the frame-support table 200, with a screw (not shown) as a sort of fixing means, such that the each cover member 222 does not intersect a plane passing through the frame-support surface 202. Thus, each of the four cover members 222 covers the upper opening of a corresponding one of the four holes 204. A central portion 224 of each cover member 222 is formed of a material having a low friction coefficient, such as a material used for forming bearings. The central portion 224 has a central hole 226 having a circular cross section. The central hole 226 permits a portion of the ball 210 to project into an outside space. The central hole 226 is defined by a portion of a semi-spherical concave surface, and the ball 210 can contact that portion of the concave surface. The respective advanced positions of the four balls 210 are defined by the four cover members 222 such that the respective upper ends of the four balls 210 held at their advanced positions project beyond the frame-support surface 202 and cooperate with one another to position the screen frame 84 at a position apart by a predetermined distance from the frame-support surface 202. Each of the four cover members 222 provides a ball-advanced-position defining device. In the state in which each of the four balls 210 is held at its advanced position, a corresponding one of the four compression coil springs 212 is kept in a compressed state in which the one spring 212 can bear a preset load somewhat greater than the load applied from the screen frame 84 to the each ball 210. The frame-support table 200 is provided with the same position adjusting device 92 as the position adjusting device 92 of the screen device 42 and the same fixing device 94 as the fixing device 94 of the same device 42, although the position adjusting device 92 or the fixing device 94 is not shown in FIG. 6A or FIG. 6B.

The position of the screen plate 80 relative to the frame-support table 200 is adjusted in the same manner as described above in the first embodiment. FIG. 6A shows the state in which the fixing device 94 is not operated to fix the plate 80 to the table 200, i.e., permits the plate 80 to be moved relative to the table 200. In this state, the ball 210 is held at its advanced position, and the upper end of the ball 210 projects beyond the frame-support surface 202. In addition, the ball 210 is rollably held in contact with the inner surface of the central portion 224 of the cover member 222 that defines the central hole 226, and the table 200 supports the frame 84 via the four balls 210 and the four coil springs 212. In this state, the balls 210 are held in contact with the cover members 222, owing to the respective preset loads of the coil springs 212. Therefore, the plate 80 placed on the balls 210 is reliably kept apart from the table 200, and is lightly moved relative to the table 200 owing to the rolling of the balls 210. Since the central portion 224 of each of the cover members 222 is formed of a material used to form bearings, the ball 210 can be lightly rolled in the state in which the ball 210 is kept in contact with the central hole 226. After the screen frame 84 is pushed by the X-direction pushing device 102 and the Y-direction pushing devices 122 and the screen plate 80 is moved to respective positions defined by the X-direction position adjusting device 100 and the Y-direction position adjusting devices 120, the frame 84 is pushed against the frame-support surface 202 by the fixing device 94, and the plate 80 is fixed to the table 200. In this state, the balls 210 are pushed by the frame 84, as shown in FIG. 6B, so that the balls 210 are separated from the respective central holes 226 formed in the respective central portions 224 of the cover members 222 and are moved, against the respective biasing forces of the compression coil springs 212, to their retracted positions where the respective upper ends of the balls 210 are aligned with the plane on which the frame-support surface 202 extends. Thus, the balls 210 permits the screen frame 84 to contact the frame-support surface 202 indirectly via the screen 82.

In the second embodiment, the balls 210 held at their advanced positions are engaged with the respective surfaces of the central portions 224 of the cover members 222 that defines the respective central holes 226, but the balls 210 held at their retracted positions are separate from the cover members 222 so that respective spaces are created between the balls 210 and the cover members 222. Since, however, only the plate-like ball retainer 206 and the compression coil spring 212 are provided in each of the four holes 204, a lot of space remains in the each hole 204. Therefore, even if dust or the like may enter the space created between each ball 210 and the corresponding cover member 222, the dust or the like would not gather around the ball 210, which would not disturb the light rolling of the ball 210.

A ball retainer and an elastic member may be provided by a single member. For example, FIG. 7 shows a screen device 230 which may be used in place of the screen device 42 in the screen printing machine shown in FIG. 1 and which includes a ball retainer 232 formed of a leaf spring as an elastic member.

The ball retainer 232 includes a ball-support portion 234 and a base portion 236 each of which has a circular cross section, and additionally includes a spring portion 238 connecting between the ball-support portion 234 and the base portion 236. The spring portion 238 has a width smaller than the diameter of the ball-support portion 234. The ball-support portion 234 has a semi-spherical concave recess 242 which retains a portion of a ball 244 such that the ball 244 is rollable. A frame-support table 246 has four holes 248 at respective positions corresponding to the four corners of the screen plate 80. Each of the four holes 248 has a circular cross section. One ball retainer 232 is fitted in each of the four holes 248. The ball-support portion 234 of the ball retainer 232 is movable in a direction of depth of the each hole 248, owing to the elastic deformation of the spring portion 238.

Each of the four ball retainers 232 retains one ball 244 such that the one ball 244 is rollable, and biases the one ball 244 toward its advanced position which is defined by a cover member 254 fixed to a counterbore 252 which is formed around one hole 248 in a frame-support surface 250 of the frame-support table 246. An upper end of the one ball 244 held at its advanced position projects beyond the frame-support surface 250. In this state, the spring portion 238 of the each ball retainer 232 is kept in an elastically deformed state in which the spring portion 238 can bear a preset load somewhat greater than the load applied from the screen frame 84 to the one ball 244. Each of the four cover members 254 has the same structure as that of each of the four cover members 222 shown in FIGS. 6A and 6B. The same reference numerals as used for the cover members 222 are used to designate the corresponding features of the cover members 254, and the description thereof is omitted. The frame-support table 246 is provided with the same position adjusting device 92 as the position adjusting device 92 of the screen device 42 and the same fixing device 94 as the fixing device 94 of the same device 42, although the position adjusting device 92 or the fixing device 94 is not shown in FIG. 7.

Figure 7:
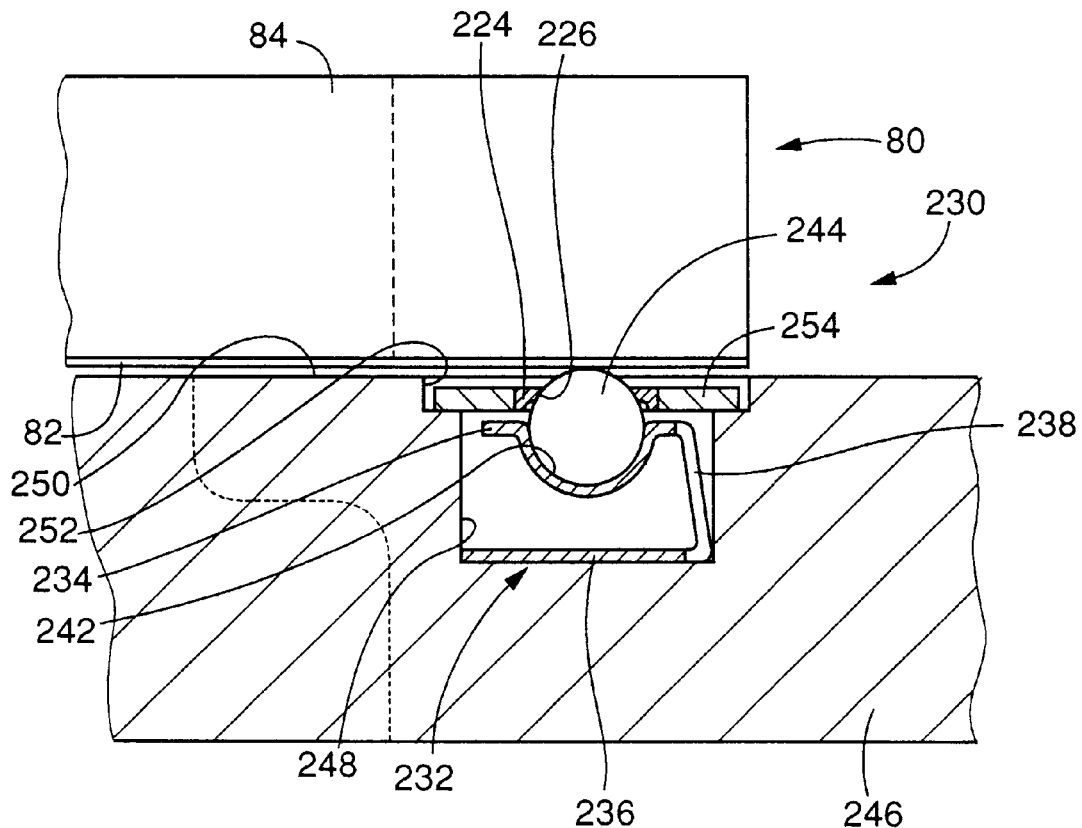
FIG. 7 is a cross-sectioned, front elevation view of one of ball units of another screen device as a third embodiment of the present invention, showing a ball at its advanced position.

FIG. 7 shows a state in which the screen plate 80 is not fixed to the frame-support table 246. In this state, the four balls 244 are held at their advanced positions where the respective upper ends of the balls 244 project beyond the frame-support surface 250, and the screen frame 84 is placed on the balls 244 and is supported by the frame-support table 246 via the balls 244 and the ball retainers 232. In this state, the balls 244 are held in contact with the cover members 252, owing to the respective loads preset to the respective leaf springs used to provide the ball retainers 232. Thus, the screen frame 84 is accurately positioned at a position apart by a predetermined distance from the frame-support surface 250. Therefore, when the position of the screen plate 80 relative to the frame-support table 246 is adjusted, the plate 80 can be lightly moved relative to the table 246. When the plate 80 is fixed to the table 246 after the adjustment of the position, the balls 244 are pushed downward by the frame 84 so that the respective spring portions 238 of the four ball retainers 232 are elastically deformed. Thus, the balls 244 are moved to their retracted positions where the respective upper ends of the balls 244 are aligned with the frame-support surface 250. Thus, the balls 244 permit the frame 84 to contact the surface 250 indirectly via the screen 82. The frame 84 is pushed against the surface 250, and the plate 80 is fixed to the table 246.

Figure 8:
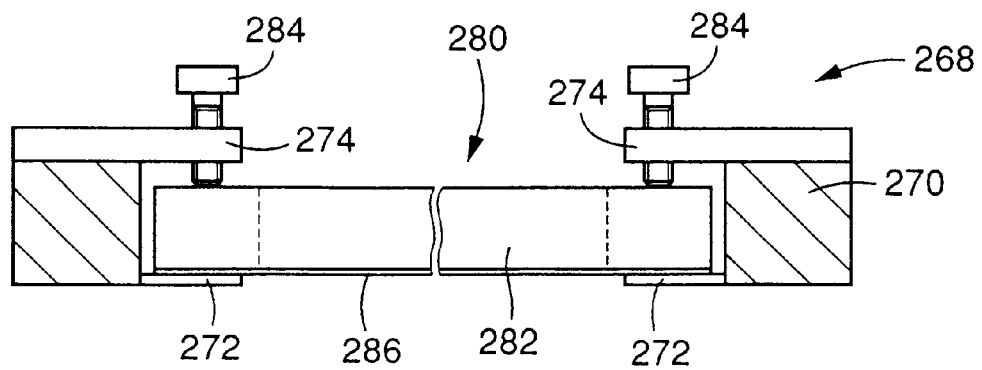
FIG. 8 is a partly cross-sectioned, front elevation view of a screen plate and a screen-plate frame of another screen device as a fourth embodiment of the present invention.

In each of the first to third illustrated embodiments, the screen plate 80 is directly fixed to the frame-support table 90, 200, 246 after the position of the plate 80 relative to the table 90, 200, 246 is adjusted. However, it is possible to employ a screen-plate frame which holds a screen plate and, after adjusting the position of the screen-plate frame relative to a frame-support table, fix the frame to the table v. In the latter case, the position of the screen plate relative to the frame-support table is adjusted indirectly via the screen-plate frame, and the screen plate is fixed to the table indirectly via the frame. FIG. 8 shows a screen device 268 including a screen-plate frame 270.

The screen-plate frame 270 has a rectangular shape and has a central window or opening. Four support plates 272 (only two plates 272 are shown in FIG. 8) are fixed to respective lower end portions of four corner portions of the screen-plate frame 270, such that respective lower surfaces of the four support plates 272 are flush with a lower surface of the frame 270. Four clamp members 274 (only two members 274 are shown in FIG. 8) are detachably attached to respective upper surfaces of the four corner portions of the frame 270, such that respective inner portions of the four clamp members 274 are opposed to the four support plates 272, respectively, in a direction of thickness of the frame 270. Four clamp screws 284 as a fixing device are screwed in respective internally threaded holes of the four clamp members 274. In a state in which all the clamp members 274 are detached from the screen-plate frame 270, a screen plate 280 including a screen 286 and a screen frame 282 is placed on the screen-plate frame 270, such that four corner portions of the screen frame 282 are supported on the four support plates 272, respectively. Subsequently, the four clamp members 274 are attached to the screen-plate frame 270, and the four clamp screws 284 are engaged with the screen frame 282 and are fastened to the same 282. Thus, the screen frame 282 is fixed to the four support portions 272, and the screen plate 280 is fixed to the screen-plate frame 270. That is, the screen-plate frame 270 holds the screen plate 280 such that the plate 280 is detachable from the frame 270. The frame 270 and the plate 280 are assembled into a unit. In the present embodiment, the position of the screen-plate frame 270 holding the screen plate 280 is adjusted, in the same manner as that in which the position of the screen plate 80 is adjusted, relative to a frame-support table (not shown) which is provided with balls, biasing devices, and balladvanced-position defining devices. Also in the same manner as that in which the screen plate 80 is fixed, the screen-plate frame 270 is fixed to the frame-support table. The frame-support table employed in the present embodiment may be any one of the frame-support tables 90, 200, 246 employed in the first to third embodiments. However, in the present embodiment, the table 90, 200, 246 has four balls 156, 210, 244, four biasing devices 192, 214, 232, and four ball-advanced-position defining devices 194, 222, 254, at respective positions corresponding to the four corners of the screen-plate frame 270.

In the first embodiment shown in FIGS. 1 to 4, 5A, and 5B, the second member 178 as part of the ball case 158 may be fixed to the unit case 154, and the first member 176 may be so modified as to be movable relative to the second member 178. In the latter case, the second member 178 functions as a cover member which provides a ball-advanced-position defining device. This feature corresponds to the third feature (3) described in SUMMARY OF THE INVENTION. In addition, the large-diameter portion 166 of each unit-hold hole 152 is regarded as a counterbore, and this feature corresponds to the fourth feature (4).

Figure 6A:
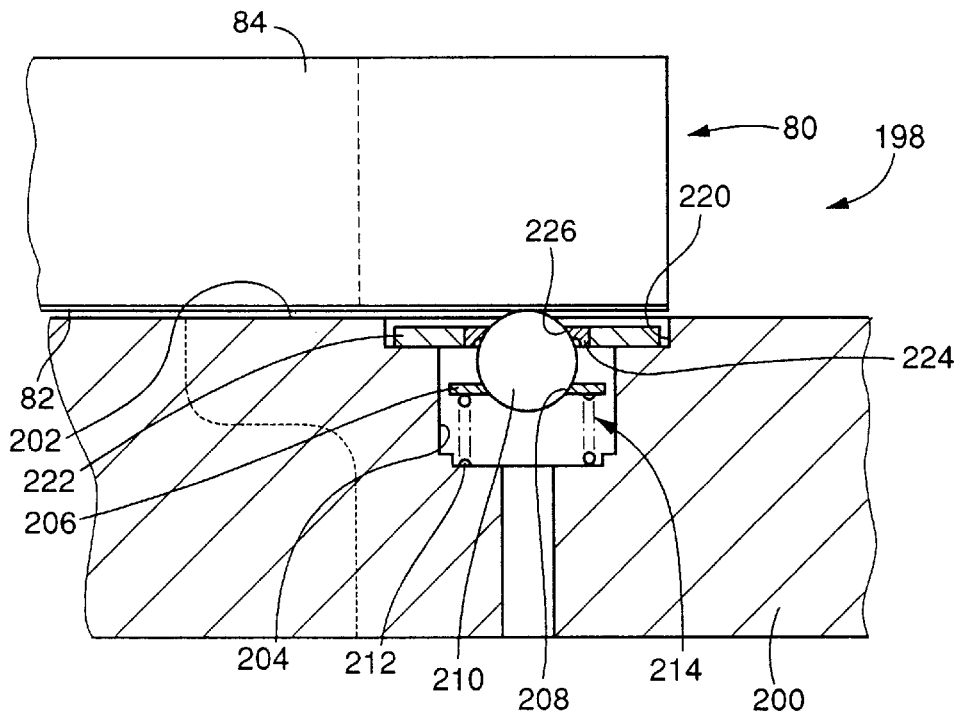
FIG. 6A is a cross-sectioned, front elevation view of one of ball units of another screen device as a second embodiment of the present invention, showing a ball at its advanced position.
Figure 6B:
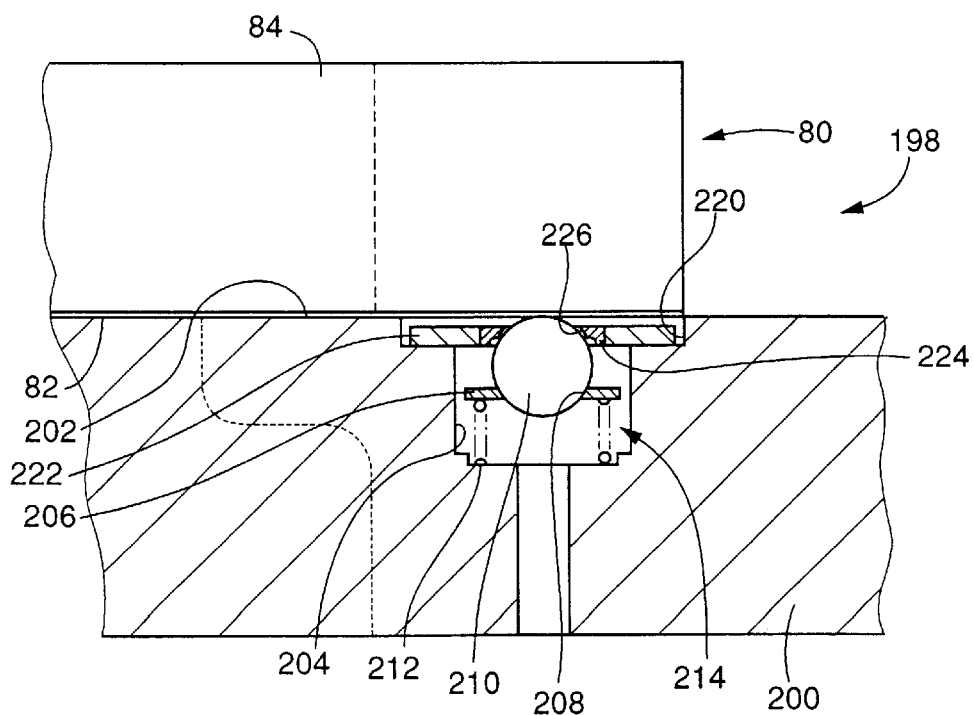
FIG. 6B is a cross-sectioned, front elevation view of the one ball unit of FIG. 6A, showing the ball at its retracted position.

In the second embodiment shown in FIGS. 6A and 6B, each of the four balls 210, a corresponding one of the four ball retainers 206, a corresponding one of the four compression coil springs 212, and a corresponding one of the four cover members 222 may be assembled in a unit case so as to provide a ball unit. In this case, the thus obtained four ball units may be fitted in, and held by, four unit-hold holes formed in the frame-support table 200.

In each of the illustrated embodiments, the frame-support table 90, 200, 246 may be provided with three or more balls 156, 210, 244, three or more biasing devices 192, 214, 232, and three or more ball-advanced-position defining devices 194, 222, 254. It is, however, preferred that the table 90, 200, 246 are provided with four or more balls 156, 210, 244, four or more biasing devices 192, 214, 232, and four or more ball-advanced-position defining devices 192, 214, 232. In the last case, it is preferred that the table has four balls, four biasing devices, and four ball-advanced-position defining devices, at respective positions corresponding to the four corners of the screen frame 84 or the screen-plate frame 270.

In each of the illustrated embodiments, the frame-support surface 190, 202, 250 of the frame-support table 90, 200, 246 is defined by a single flat surface, and the lower surface of the screen frame 84 that contacts the frame-support surface 190, 202, 250 is also defined by a single flat surface. However, this is not an essentially required feature. For example, at least one of the frame-support surface 190, 202, 250 and the lower surface of the screen frame 84 may be defined by a stepped surface. This means that it is not an essentially required feature that the upper end of each of the four balls 156, 210, 244 held at its advanced position projects beyond the frame-support surface and the upper end of each ball held at its retracted position is aligned with the frame-support surface. According to the present invention, it is just required that the four balls held at their advanced positions cooperate with one another to position the screen frame 84 or the screen-plate frame 270 at a position apart by a predetermined distance from the frame-support surface and that the four balls held at their retracted positions permit the screen frame (or the screen fixed to the screen frame) or the screen-plate frame to contact the frame-support table. For example, it is possible to employ a frame-support table having a step between its frame-support surface, and the surface of its portion in which balls, etc. are provided, and employ a screen frame or a screen-plate frame having a step between its first surface to contact the frame-support surface, and its second surface to contact the balls. In the last case, the upper end of each ball held at its retracted position remains below, or projects beyond the frame-support surface, depending upon whether the second surface projects beyond, or remains below, the first surface, respectively.

In each of the illustrated embodiments, a single position adjusting operation is carried out for each screen plate 80 or each screen-plate frame 270, that is, for the first one of a plurality of circuit boards 14 to which creamed solder is to be applied using the each screen plate 80, or the screen plate 280 held by the each screen-plate frame 270. However, it is possible to carry out a position adjusting operation for each of a plurality of circuit boards 14, or every second circuit board 14, every third, or so on, out of a number of circuit boards 14. More specifically described, a positional-error detecting operation is carried out to detect a positional error of a screen plate or a screen-plate frame relative to each board 14, or every second or third board 14 and, if an positional error is detected, a position adjusting operation is carried out to adjust the position of the screen plate or the screen-plate frame relative to a frame-support table.

While the present invention has been described in detail in its preferred embodiments, it is to be understood that the present invention is by no means limited to the details of those embodiments but may be embodied with not only the features (1) to (13) described in SUMMARY OF THE INVENTION but also other changes, modifications, and improvements that may occur to one skilled in the art without departing from the scope and spirit of the present invention defined in the appended claims.

What is claimed is:

1. A screen apparatus, comprising:

a screen plate including a screen and a screen frame to which a peripheral portion of the screen is fixed;

a frame-support table having a frame-support surface which supports the screen frame of the screen plate;

a position adjusting device which is connected to the frame-support table and which adjusts a position of the screen plate relative to the frame-support table in a direction parallel to the screen;

a fixing device which, when the position adjusting device adjusts the position of the screen plate, permits the screen plate to be moved relative to the frame-support table and, after the adjustment of the position, presses the screen frame against the frame-support surface of the frame-support table, thereby fixing the screen plate to the frame-support table;

at least three balls which are supported by at least one of the screen frame and the frame-support table such that each of the balls is movable between an advanced position thereof and a retracted position thereof;

at least three biasing devices each of which supports a corresponding one of the balls such that said one ball is rollable and which biases said one ball toward the advanced position thereof; and at least three advanced-position defining devices which define the respective advanced positions of the balls where the balls cooperate with each other to position the screen frame at a position apart by a predetermined distance from the frame-support surface of the frame-support table.

2. An apparatus according to claim 1, wherein said each of the biasing devices comprises:

a ball retainer which retains said one ball such that said one ball is rollable; and an elastic member which is provided between the ball retainer and said at least one of the screen frame and the frame-support table and which biases the ball retainer toward the other of the screen frame and the frame-support table, thereby biasing said one ball toward the advanced position thereof.

3. An apparatus according to claim 1, wherein each of the advanced-position defining devices comprises a cover member which covers an opening of a corresponding one of at least three holes which are formed in said at least one of the screen frame and the frame-support table and which accommodate the balls, respectively, the cover member permitting the ball accommodated in said one hole to be biased toward the advanced position thereof where a portion of the ball projects into a space outside the cover member.

4. An apparatus according to claim 3, wherein the holes are formed in the frame-support table, and the cover member of said each of the advanced-position defining devices is fixed to the frame-support table, such that the cover member is entirely accommodated in a corresponding one of at least three counterbores formed in the frame-support surface of the frame-support table.

5. An apparatus according to claim 2, wherein the ball retainer of said each of the biasing devices is fitted in a corresponding one of at least three holes which are formed in said at least one of the screen frame and the frame-support table and which accommodate the balls, respectively, the ball retainer being movable in said one hole in a direction of depth thereof, the ball retainer having, in a central portion thereof, a hole which permits a portion of the ball accommodated in said one hole to be fitted therein.

6. An apparatus according to claim 5, wherein the ball retainer comprises a circular plate member having a central hole formed through a thickness of the central portion thereof.

7. An apparatus according to claim 2, wherein the elastic member comprises a compression coil spring.

8. An apparatus according to claim 2, wherein the ball retainer and the elastic member are provided by an integral member.

9. An apparatus according to claim 1, wherein each of the balls, a corresponding one of the biasing devices, and a corresponding one of the advanced-position defining devices are provided by a corresponding one of at least three ball units, and each of the ball units is held in a corresponding one of at least three unit-hold holes formed in said at least one of the screen frame and the frame-support table.

10. An apparatus according to claim 9, wherein said each of the ball units comprises a ball case which retains a corresponding one of the balls such that said one ball is rollable, a portion of said one ball projects into a space outside the ball case, and said one ball is not separable from the ball case, the biasing device of said each ball unit comprising the ball case and an elastic member which biases the ball case.

11. An apparatus according to claim 10, wherein the ball case has a semi-spherical concave bottom surface which supports said one ball, via a plurality of round members each of which has a diameter smaller than a diameter of said one ball, such that said one ball is rollable.

12. An apparatus according to claim 10, wherein said each of the ball units further comprises a unit case which accommodates the ball case such that the ball case is movable relative to the unit case, the elastic member being provided between the unit case and the ball case, the unit case having a stopper which defines a limit of movement of the ball case caused by a biasing force of the elastic member, the advanced-position defining device of said each ball unit comprising the stopper.

13. A screen apparatus, comprising:

a screen plate including a screen and a screen frame to which a peripheral portion of the screen is fixed;

a screen-plate frame which holds the screen plate such that the screen plate is detachable therefrom;

a frame-support table having a frame-support surface which supports the screen-plate frame;

a position adjusting device which is connected to the frame-support table and which adjusts a position of the screen-plate frame relative to the frame-support table in a direction parallel to the screen;

a fixing device which, when the position adjusting device adjusts the position of the screen-plate frame, permits the screen-plate frame to be moved relative to the frame-support table and, after the adjustment of the position, presses the screen-plate frame against the frame-support surface of the frame-support table, thereby fixing the screen-plate frame to the frame-support table;

at least three balls which are supported by at least one of the screen-plate frame and the frame-support table such that each of the balls is movable between an advanced position thereof and a retracted position thereof;

at least three biasing devices each of which supports a corresponding one of the balls such that said one ball is rollable and which biases said one ball toward the advanced position thereof; and at least three advanced-position defining devices which define the respective advanced positions of the balls where the balls cooperate with each other to position the screen-plate frame at a position apart by a predetermined distance from the frame-support surface of the frame-support table.

* * * * *